United States Patent [19]

Sekii

[11] Patent Number: 5,220,278
[45] Date of Patent: Jun. 15, 1993

[54] FIXING CARD FOR USE WITH HIGH FREQUENCY

[75] Inventor: Tomoe Sekii, Fukuoka, Japan

[73] Assignee: Kabushiki Kaisha Toshiba, Kawasaki, Japan

[21] Appl. No.: 644,437

[22] Filed: Jan. 22, 1991

[30] Foreign Application Priority Data

Jan. 23, 1990 [JP] Japan .................................. 2-13314

[51] Int. Cl.⁵ ........................ G01R 1/06; G01R 31/07
[52] U.S. Cl. ................................ 324/158 P; 324/158 F
[58] Field of Search ............... 324/158 P, 158 F, 72.5; 439/482, 824

[56] References Cited

U.S. PATENT DOCUMENTS

| | | | |
|---|---|---|---|
| 3,832,632 | 8/1974 | Ardezzone | 324/158 P |
| 3,835,381 | 9/1974 | Garretson et al. | 324/158 P |
| 4,352,061 | 9/1982 | Matrone | 324/158 P |
| 4,585,991 | 4/1986 | Reid et al. | 324/158 P |
| 4,647,851 | 3/1987 | Dugan | 324/158 P |
| 4,780,670 | 10/1988 | Cherry | 324/158 F |
| 4,963,821 | 10/1990 | Janko et al. | 324/158 F |
| 4,983,908 | 1/1991 | Tada et al. | 324/158 P |
| 5,041,783 | 8/1991 | Ohta et al. | 324/158 P |
| 5,091,694 | 2/1992 | Ikeda et al. | 324/158 P |

*Primary Examiner*—Vinh Nguyen
*Attorney, Agent, or Firm*—Finnegan, Henderson, Farabow, Garrett & Dunner

[57] ABSTRACT

A fixing card for high frequency testing includes an insulation substrate, a measuring circuit formed on the top of the insulating substrate, through-holes formed at the center portion of the insulating substrate, and a fixing ring attached to the underside of the insulating substrate for enclosing the through-holes of the substrate. Probes are fixed to the underside of the insulating substrate and extend through the through-holes to electrically connect with the measuring circuit. In this manner the measuring circuit is located a very short distance from a die sorter being measured, permitting the use of a high frequency band.

5 Claims, 2 Drawing Sheets

FIXING CARD FOR USE WITH HIGH FREQUENCY

BACKGROUND OF THE INVENTION

1. Field of the Invention

The present invention relates to a fixing card for use with high frequency to carry out the die sorter test relative to active and passive elements formed on a semiconductor substrate.

2. Description of the Related Art

The so-called probe card is used to test characteristics of active and passive elements formed on a semiconductor substrate and those of such circuit parts as resistances arranged on the substrate independently of the active and passive elements. The probe card comprises an insulating board and probes (or probe needles) attached to the insulating board. The probes are made of conductive metal such as tungsten, vanadium alloy and beryllium alloy. The number of the probes is determined to correspond to that of pads which are formed on the semiconductor substrate to correspond to the active and passive elements and the circuit parts.

The probe card is used in the characteristic test process, as shown in FIGS. 1A and 1B, to examine electric characteristics of the active elements and the like on the semiconductor substrate as follows. FIG. 1A is a plan showing the main portion of the probe card and FIG. 1B is a front view showing the probe card used. Reference numeral 1 represents a through-hole. An insulating board 2 provided with the through-hole 1 at the center thereof includes probes 3 which extend radially from the through-hole 1. The insulating board 2 further includes at the rim portion thereof connectors for connecting the probes 3 to an IC tester (not shown). The connectors are electrically connected to the probes 3.

A fixing ring 4 made of material such as aluminium, plastics and ceramics is attached to one side of the insulating board 2, enclosing the through-hole 1, as shown in FIG. 1B, at the time when the die sorter test is to be carried out. Using the probing process applied to the insulating board 2, the probes 3 are fixedly soldered to that side of the insulating board 2 to which the fixing ring 4 is attached. The probe 3 extend downward along the slope of the fixing ring 4 with their one ends fixed by a specific bonding layer 5 so that they may be tilted relative to the underside of the insulating board 2 at a certain angle. The bonding layer 5 preferably used has a heat shrinkage rate less than ±5 μm to ensure accuracy in position of the probe 3 when the die sorter test is carried out under a high temperature between 90° C. and 120° C. This is because the tip of each probe 3 which is contacted with the pad is appropriately positioned. As apparent from Fig. 1C (which shows only the main portion of the fixing card), that portion of each probe 3 which is extended from the fixing ring (and which is called the beam length of the probe 3) is set 5.5±0.5 mm long. This beam length of each probe 3 has a height of 500 μm when measured from the lower end of the fixing ring 4 in the vertical direction, and each probe 3 has a height of 2500±300 μm or more when measured from the under-side of the insulating board 2 in the vertical direction. The die sorter measurement is carried out while keeping the probes 3 correctly contacted with pads 7 formed on an integrated circuit element 6, and the number of the probes 3 are set equal to that of the pads 7.

The integrated circuit elements have been made these days to have extremely high integration, function and speed, as seen in the case of D-RAMs. This makes it necessary to carry out the die sorter test at high speed and with high frequency.

As apparent from FIG. 1B, however, the probes 3 are radially arranged on the underside of the insulating board 2 so as to correctly contact their tips with the pads on the integrated circuit element. This is because the print pattern is shaped radial. The distance extending from the device under test (DUT) needed to apply the die sorter measurement to the integrated circuit element to the pads which serve as measuring terminals on the integrated circuit element is thus made long, thereby causing the high frequency measurement not to be smoothly carried out. No high frequency measurement can be applied to some kinds of the integrated circuit elements.

SUMMARY OF THE INVENTION

The object of the present invention is therefore to provide a fixing card for use with high frequency enabling the die sorter test or measurement to be conducted at a high frequency band so a to enhance the reliability of the test and reduce the cost of it.

According to the present invention, there can be provided a fixing card for use with high frequency comprising a measuring circuit pattern formed on the top of a transparent insulating substrate, through-holes formed at the center portion of the insulating substrate, a fixing ring attached to the underside of the insulating substrate, enclosing the through-holes of the substrate, and probes fixed to the underside of the insulating substrate and to the fixing ring while extending their one ends to the through-holes and keeping them electrically contacted with the measuring circuit pattern.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below to explain the principles of the invention.

DETAILED DESCRIPTION OF THE PREFERRED EMBODIMENTS

Figure 1A:
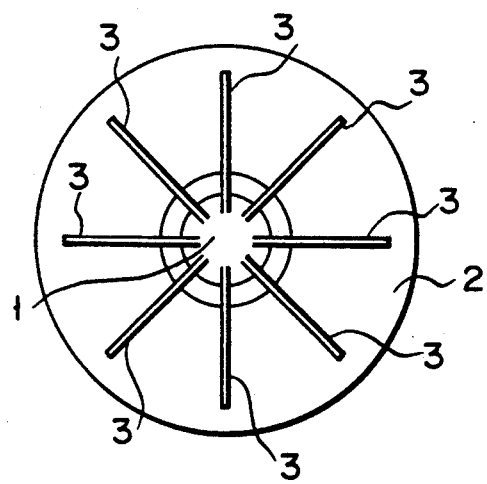
FIG. 1A is a plan showing the main portion of the conventional card.
Figure 1B:
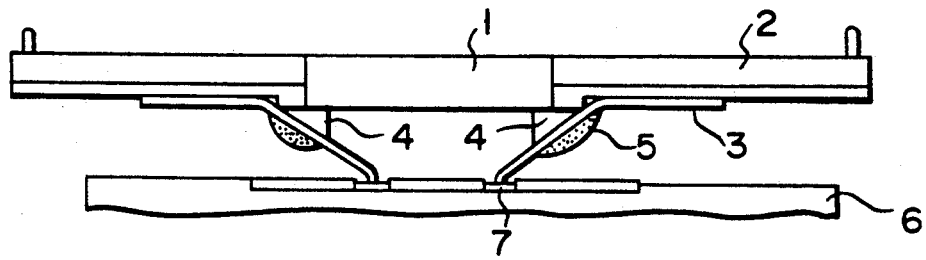
FIG. 1B is a front view showing the probe card used.
Figure 1C:
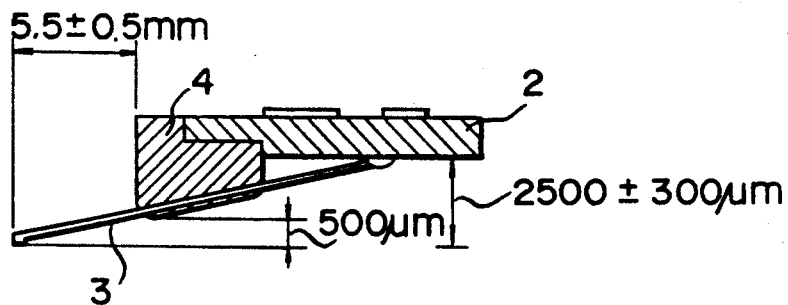
FIG. 1C is intended to explain problems of the probe card.
Figure 2A:
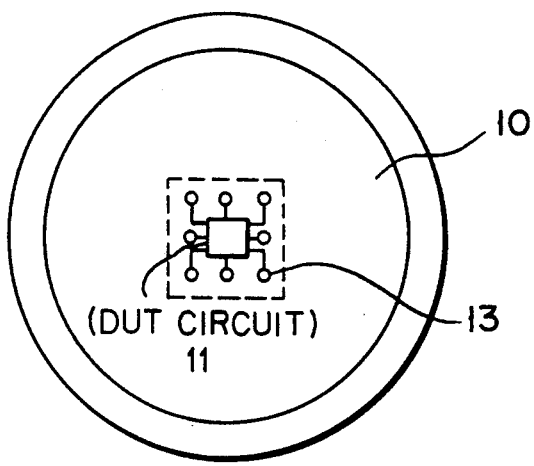
FIGS. 2A through 2C show the arrangement of an example of the fixing card for use with high frequency according to the present invention.
Figure 2B:
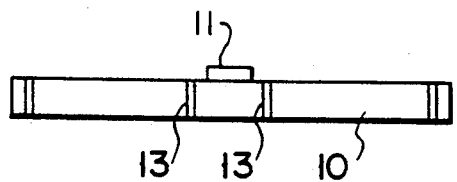

An example of the fixing card for use with high frequency according to the present invention will be described in detail with reference to FIGS. 2A through 2G. The fixing card used at a high frequency band (which will be hereinafter referred to as the high frequency fixing card) includes a transparent insulating substrate or board 10 made of a single material such as hard glass, quartz glass, ruby and sapphire or plural or composite materials having same characteristics as those of the above-mentioned materials, as shown in FIG. 2A. A DUT measuring circuit 11 needed to conduct the die sorter test is formed on one side of the insulating board 10. Different from the conventional ones, the transparent insulating board 10 has no through-hole in the center thereof, but it is provided with through-holes 13 which are positioned, as shown in FIG. 2A, to correspond to pads on an integrated circuit element to be measured and through which probes 12 (see FIGS. 2D through 2G) are to be inserted.

Figure 2C:
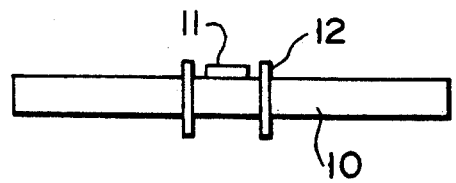

FIG. 2C shows the probes 12 inserted into the through-holes 13. The probes 12 are moved just above the pads on the integrated circuit element by manual operation in which a microscope is used, and they are then contacted with the pads to carry out the die sorter measurement.

Figure 2D:
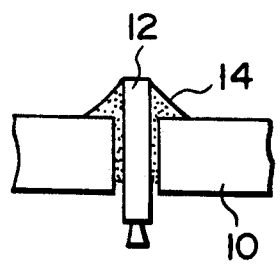
Figure 2E:
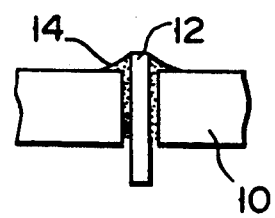
Figure 2F:
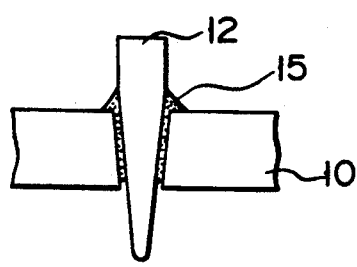
Figure 2G:
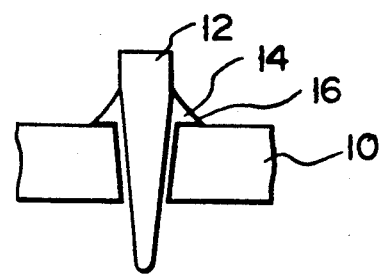

Various kinds of the probes 12 are inserted, as shown in FIGS. 2C through 2G, into the through-holes 13 of the insulating board 10 which is provided with the DUT measuring circuit 11 on one side thereof, and they are positioned just above the pads on the integrated circuit element to be measured. FIG. 2D shows the probes 12 of the spring pin type inserted into the through-holes 13 and FIG. 2E shows the common probes 12 inserted into the through-holes 13. The probes 12 are fixed to the insulating board 10 by solder layers 14 in any of the cases. In addition, a fixing ring may be attached to the underside of the insulating substrate for covering through-hole 13 and for fixing the probes 12 to the underside of the substrate. FIGS. 2F and 2G show tapered probes 12 inserted into the through-holes 13, wherein the probes 12 are fixed to the board 10 by bonding resin layers 15 in the former case and they are inserted into the through-holes 13 and fixed to the board 10 by solder layers 14 after a plating layer 16 is applied to each through-hole 13 in the latter case.

A pad formed on the integrated circuit element to be measured is usually shaped like a square having a side 100 μm long and the smallest has a side 80 μm long. To meet this, the diameter of the probe tends to become smaller and even the probe having one side of 20-30 μm has been developed these days. Therefore, it becomes extremely difficult to visually confirm the tracks of the probes which are contacted with the pads. Needless to say, the prober fully automated using sensors has been developed. Satin finish is intendedly formed, in some cases, on each probe of this prober by the blast process to enhance the contact sensibility of the probe. In the case of this fully-automated prober, however, the manual operation or operation of visually confirming that the probes are contacted with the pads is needed as a part of the test process. When one side of each pad is 100 μm or less, it is quite difficult to confirm the probe tracks each having a size of 20-30 μm. It is naturally quite difficult to mechanically confirm these probe tracks and a greater cost increase is needed to fully automate this confirming process.

According to the high frequency fixing card of the present invention having the above-described arrangement, however, the die sorter measurement can be conducted while positioning the probes 12 just above the pads on the integrated circuit element to be measured. In addition, the transparent insulating board is provided with the DUT measuring circuit, thereby making the length of leads extremely shorter. Further, resistances, condensers and the like at the final stage of the DUT measuring circuit can be positioned nearest to the integrated circuit element to be measured. Furthermore, the positioning and contacting of the probes relative to the pads can be made easier because the insulating board is transparent. As the result, the measurement can be conducted at a high frequency band and the accuracy of the measurement can be made higher.

What is claimed is:

1. A fixing card for inspecting high-frequency characteristics of an integrated circuit element hiving electrode pads thereon, the fixing card comprising:
   a transparent insulating substrate having an upper surface and downwardly converging tapered through-holes formed about a center section thereof, the through-holes each having a central axis that extends substantially perpendicular to the upper surface, said through-holes being arranged to correspond to the electrode pads on the integrated circuit element;
   tapered probes inserted in the through-holes and arranged to contact the pads, the probes being tapered to conform to said tapered through-holes and extending in a direction substantially perpendicular to the upper surface of the substrate;
   fixing means for fixing the probes to the insulating substrate; and
   a measuring circuit formed on the insulating substrate and connected to the probes, the circuit being constructed to perform a specific inspection of the integrated circuit element.

2. A fixing card according to claim 1, wherein the insulating substrate includes at least one material selected from the group consisting of hard glass, quartz glass, ruby, sapphire, and materials having the same characteristics as those of the above-mentioned materials.

3. A fixing card according to claim 1, wherein the fixing means comprises a solder layer.

4. A fixing card according to claim 1, wherein the fixing means comprises a bonding resin layer.

5. A fixing card according to claim 1, wherein the fixing means comprises a solder layer with a plating layer interposed between the solder layer and the substrate.

* * * * *